(12) United States Patent
Lee et al.

(10) Patent No.: US 7,626,250 B2
(45) Date of Patent: Dec. 1, 2009

(54) HIGH POWER LED PACKAGE AND FABRICATION METHOD THEREOF

(75) Inventors: Seon Goo Lee, Kyungki-do (KR); Hun Joo Hahm, Kyungki-do (KR); Jung Kyu Park, Seoul (KR); Kyung Taeg Han, Kyungki-do (KR); Seong Yeon Han, Kyungki-do (KR); Dae Yeon Kim, Kyungki-do (KR); Young Sam Park, Seoul (KR)

(73) Assignee: Samsung Electro-Mechanics Co., Ltd., Kyungki-Do (KR)

( * ) Notice: Subject to any disclaimer, the term of this patent is extended or adjusted under 35 U.S.C. 154(b) by 172 days.

(21) Appl. No.: 11/445,227

(22) Filed: Jun. 2, 2006

(65) Prior Publication Data
US 2006/0273338 A1    Dec. 7, 2006

(30) Foreign Application Priority Data
Mar. 3, 2005    (KR) .................. 10-2005-0047782

(51) Int. Cl.
*H01L 23/495* (2006.01)
(52) U.S. Cl. .................. 257/675; 257/99; 257/100; 257/717; 257/E33.057; 257/E33.066
(58) Field of Classification Search .................. 257/99, 257/100, 675, 717, E33.057, E33.066
See application file for complete search history.

(56) References Cited

U.S. PATENT DOCUMENTS

| | | | | |
|---|---|---|---|---|
| 6,541,800 | B2 * | 4/2003 | Barnett et al. | 257/98 |
| 7,119,422 | B2 * | 10/2006 | Chin | 257/666 |
| 7,138,667 | B2 * | 11/2006 | Barnett et al. | 257/99 |
| 7,264,378 | B2 * | 9/2007 | Loh | 362/294 |
| 7,280,288 | B2 * | 10/2007 | Loh et al. | 359/726 |
| 2003/0168720 | A1 | 9/2003 | Kamada | |
| 2004/0075100 | A1 | 4/2004 | Bogner et al. | |
| 2004/0140543 | A1 | 7/2004 | Elpedes et al. | |

(Continued)

FOREIGN PATENT DOCUMENTS

JP    58-173248    11/1983

(Continued)

OTHER PUBLICATIONS

Japanese Office Action issued in Japanese Patent Application No. JP 2006-154790 dated Apr. 28, 2009.

*Primary Examiner*—Zandra Smith
*Assistant Examiner*—Telly D Green
(74) *Attorney, Agent, or Firm*—McDermott Will & Emery LLP

(57) ABSTRACT

An LED diode package includes a heat connecting part for mounting a light emitting part on an upper surface thereof, frames electrically connected to the light emitting part while holding the heat connecting part and a molded part fixing the heat connecting part and the frames together. The light emitting part generates light in response to current applied thereto, and the upper surface of the heat connecting part is protruded beyond an upper surface of the molded part to a predetermined height. This can optimize the unique beam angle of the light source thereby to maximize lighting efficiency as well as prevent overflow of the encapsulating material in the assembling process of the lens, which may otherwise soil adjacent components.

21 Claims, 11 Drawing Sheets

U.S. PATENT DOCUMENTS

| | | |
|---|---|---|
| 2005/0135105 A1* | 6/2005 | Teixeira et al. ............... 362/294 |
| 2006/0180824 A1* | 8/2006 | Kim et al. .................... 257/99 |
| 2006/0180925 A1* | 8/2006 | Lee et al. .................... 257/717 |
| 2006/0267036 A1* | 11/2006 | Lee et al. ..................... 257/98 |

FOREIGN PATENT DOCUMENTS

| | | |
|---|---|---|
| JP | 2002-532880 A | 10/2002 |
| JP | 2003-303936 | 10/2003 |
| JP | 2003-332634 A | 11/2003 |
| JP | 2004-221598 A | 8/2004 |
| WO | WO 00/35010 | 6/2000 |

* cited by examiner

A-A'

B-B'

HIGH POWER LED PACKAGE AND FABRICATION METHOD THEREOF

RELATED APPLICATION

The present application is based on and claims priority from Korean Application Number 10-2005-0047782, filed Jun. 3, 2005, the disclosure of which is hereby incorporated by reference herein in its entirety.

BACKGROUND OF THE INVENTION

1. Field of the Invention

The present invention relates to a high power LED package and a fabrication method thereof, more particularly, in which a molded part that integrally fixes frames together with a heat connecting part, and a light source is disposed above the upper surface of the molded part to optimally utilize unique beam angle thereof, thereby maximizing light efficiency.

2. Description of the Related Art

In general, an LED (Light Emitting Diode) is a semiconductor device generating light when current flows through it, and is provided in the form of a PN junction diode made of for example GaAs or GaN optical semiconductor that converts electric energy into light energy.

The light spectrum of such an LED ranges from red (e.g., 630 nm to 700 nm) to blue-violet (e.g., 400 nm) including blue, green and white lights. With such merits as low power consumption, high efficiency, and longer operation and lifetime compared with the conventional light sources such as incandescent lamps and fluorescent lamps, the demand for the LED is steadily increasing.

Recently, the LED has been expanding in its application from small-sized illumination of mobile terminals to areas such as indoor/outdoor illumination, automobile illumination, and backlights for large-sized Liquid Crystal Displays (LCD).

In the meantime, power applied to the semiconductor is increased in proportion to the intensity of light to be generated in response to current applied. Thus, with high level of power consumption, the LED typically adopts a heat connecting structure to prevent the semiconductor device and the package itself from being damaged from the heat generated during the emission of light.

FIG. 6a is a perspective view of a conventional high power LED package mounted on a board, taken vertically along an optical axis thereof, and FIG. 6b is a front elevation view of the conventional LED package of FIG. 6a. As shown in FIGS. 6a and 6b, the conventional high-power LED package 10 includes a semiconductor device 11 serving as a light source and a heat connecting structure 12 with the semiconductor device 11 mounted on the center of the upper surface thereof.

The semiconductor device 11 is electrically connected via a plurality of metal wires 13 to a plurality of lead frames 14 and thus to an external power source so as to be supplied with power.

The heat connecting structure 12 is mounted on a board 19 via an adhesion means 12a made of material of high heat conductivity in order to discharge heat, which is generated when the semiconductor device 11 emits light, thereby cooling down the package.

In the conventional LED package, the lead frame 14 is integrated to a molded part 15. The molded part 15 has an assembly hole formed therethrough so that the heat connecting structure 12 is inserted into the center of the molded part 15 to be assembled together. The lead frame 14 has one end exposed to the inside of the molded part 15 to be wire-bonded with the wire 13, and has the other end electrically connected via a pad 14a to a circuit pattern 19a printed on the board 19.

A lens 16 is provided on the upper surface of the mold part 15 to extensively spread the light generated from the semiconductor device 11 to the outside. The space between the molded part 15 and the lens 16 is filled with encapsulating material 17 made of transparent silicone resin to project the emitted light while protecting the semiconductor device 11 and the wires 1.

However, the conventional LED package 10 having such a structure entails a process of forming an assembly hole 15a and inserting the heat connecting structure 12 into the center of the molded part 15 through the assembly hole 15a. Therefore, the assembly structure and process is too complicated to be fully automated, lowering productivity. In addition, the package disadvantageously has a large volume.

A cup-shaped reflector 18 is provided in the top portion of the heat connecting structure 12 where the semiconductor device 11 is mounted. The reflector 18 is depressed downward and reflective material is applied to the outer surface of the reflector 18, by which light when emitted can be concentrated along the optical axis.

When the semiconductor device 11 generates light, the light in part is first reflected by the reflector 18, and thus concentrated forward along the optical axis. However, since the light passes the lens 16 in part directly and in part upon reflecting from the reflector 18, it should be considered in designing of the lens 16. This as a result degrades the degree of freedom in lens design.

With this arrangement of the semiconductor device 11, the top portion of the molded part 15 or of the heat connecting structure 12 partially blocks the light generated to restrict or narrow view angle or beam angle that is a diverging angle of the light. Thus, this LED package type is not suitable for an illumination light source that is required to uniformly light a wide area by optimally using the unique beam angle of the semiconductor device 11.

Furthermore, in assembling of the lens 16 with the encapsulating material 17 interposed between the molded part 15 and the lens 16, the encapsulating material 17 may flow out of the lens 16, soiling the lead frames 14 and adjacent components.

In the meantime, U.S. patent publication No. 2004/0075100 (published on Apr. 22, 2004) discloses an LED package structure including a heat connecting part with a semiconductor device mounted thereon as a light source, a lead frame connected to the heat connecting part and a molded part injection-molded to integrally fix the heat connecting structure with the lead frame. In corresponding regions of the molded part and the heat connecting part where a semiconductor device is mounted, there is formed a cup-shaped reflector depressed downward to reflect light.

This LED package structure may omit an assembling process of the heat connecting part by providing a molded part to wrap both of the heat connecting part and the lead frame through injection molding. However, an additional process is needed in which the heat connecting part is connected with the lead frame before the injection molding. Furthermore, this structure also has a defect in that an electrode of the lead frame is susceptible to short-circuit under external impact.

Moreover, with the arrangement of the semiconductor device, the top portion of the molded part partially blocks the light generated to restrict or narrow the beam angle of the light. Thus, this LED package structure is not suitable for an illumination light source that is required to uniformly light a wide area by optimally using the unique beam angle of the semiconductor device.

Such conventional LED packages have an up-set lead frame structure, in which the lead frame is bent at a lower end in parallel to the board, bent upward at a right angle or sloped upward, and bent at an upper end in parallel to the board toward the device. In this structure, the intermediate portions and the lower end of the lead frame are excessively protruded out of the molded part, and when the package is mounted on a board of an application device, occupy a large area on the board, which is an obstacle to the miniaturization of the application device.

Moreover, the lead frame is bent after the injection molding, the electrode is highly susceptible to short-circuit or defect owing to external force generated by the bending process.

SUMMARY OF THE INVENTION

The present invention has been made to solve the foregoing problems of the prior art and therefore an object of certain embodiments of the present invention is to provide a high power LED package capable of optimally utilizing unique beam angle of a light source, thereby maximizing light efficiency and lighting performance.

Another object of certain embodiments of the invention is to provide a high power LED package capable of preventing overflow of encapsulating material in an assembling process of a lens, which may otherwise soil adjacent components.

Further another object of certain embodiments of the invention is to provide a high power LED package capable of eliminating consideration on light reflection and thus giving high degree of freedom to lens design so that various lens types can be adopted.

Another object of certain embodiments of the invention is to provide a high power LED package capable of minimizing those portions and volumes of lead frames exposed to the outside, and when the package is mounted on a board, reducing the mounting space of the package on the board, thereby promoting miniaturization of a product.

Yet another object of certain embodiments of the invention is to provide a fabrication method of a high power LED package capable of integrally fixing frames and a heat connecting part through injection molding, thereby simplifying a fabrication process as well as saving costs by mass production.

According to an aspect to realize the foregoing object, the invention provides a high power LED package comprising: a heat connecting part for mounting a light emitting part on an upper surface thereof, the light emitting part generating light in response to current applied thereto; frames electrically connected to the light emitting part while holding the heat connecting part; and a molded part fixing the heat connecting part and the frames together, wherein the upper surface of the heat connecting part is protruded beyond an upper surface of the molded part to a predetermined height so that the upper surface of the heat connecting part is positioned higher than the upper surface of the molded part.

Preferably, the light emitting part comprises at least one LED.

Preferably, the heat connecting part is protruded from the upper surface of the molded part to a predetermined height so that light generated from the light emitting part on the heat connecting part has a beam angle of 180° or more.

Preferably, the heat connecting part comprises a heat conductive metal member for transferring heat generated from the light emitting part to a board, the heat being generated during light emission of the light emitting part. More preferably, the heat conductive metal member comprises at least one selected from the group consisting of Cu, Ag, Al, Fe, Ni, W and alloys containing at least one thereof.

Preferably, the heat connecting part has planar top and underside surfaces, and has a holding portion formed in an outer circumference of a body thereof to contact leading ends of the frames, thereby generating holding force. More preferably, the holding portion comprises a groove continuously extending around the outer circumference of the heat connecting part body.

Preferably, the heat connecting part is extended through the molded part so that the underside surface of the heat connecting part is exposed to the outside through an underside surface of the molded part.

Preferably, the heat connecting part has a reflector formed in a top portion thereof where the light emitting part is mounted, the reflector being depressed to a predetermined depth to have an inclined reflecting surface.

Preferably, the frames comprise a pair of electrode frames electrically connected with the light emitting part via wires and at least one holder frame electrically isolated from the electrode frames, the holder frame having a leading end contacting and held by the heat connecting part.

Preferably, the pair of electrode frames are disposed at both sides of the heat connecting part opposing each other, and the holder frame is disposed between the electrode frames. More preferably, the holder frame comprises a pair of frames each of which is disposed between the electrode frames.

More preferably, each of the electrode frames has an upper end exposed to the outside through the upper surface of the molded part, a lower end exposed to the outside through an underside surface of the molded part and a body buried in the molded part, the electrode frame bent to give a height difference between the upper and lower ends.

More preferably, the electrode frames and a pair of the holder frame are disposed around the heat connecting part with a uniform interval.

More preferably, the holder frame has an upper end contacting an outer surface of the heat connecting part to generate holding force, a lower end exposed to the outside through the molded part and a body buried in the molded part, the holder frame bent to give a height difference between the upper and lower ends.

More preferably, the leading end of the holder frame is formed straight to have a line contact with an outer surface of the heat connecting part.

More preferably, the leading end of the holder frame is arched inward to have a surface contact with an outer surface of the heat connecting part.

Preferably, the molded part has cutaway portions formed in exterior portions thereof to expose lower ends of the frames to the outside. More preferably, the cutaway portions are depressed from the exterior portions of the molded part corresponding to the frame lower ends, and sized wider than the width of the frames.

The high power LED package may further comprise: at least one lens capped on an upper section of the molded part to project the light generated from the light emitting part to the outside at an increased beam angle; and an encapsulating material filled in a space between the molded part and the lens. Preferably, the molded part has an assembly step formed in the upper surface thereof, the assembly step fitted to a lower inner circumference of the lens.

Preferably, the molded part has a groove formed in the upper surface thereof, the groove receiving the encapsulating material when it is more than filling up the space between the lens and the molded part, thereby preventing the encapsulating material from flowing to the outside. More preferably, the groove is continuously extended along a lower outer circumference of the lens.

According to another aspect to realize the foregoing object, the invention provides a fabrication method of a high power LED package, comprising steps of: a) preparing a frame sheet with a pair of opposing electrode frames and at least one holder frame machined therein; b) inserting a heat connecting part into the frame sheet so that a leading end of the holder frame contacts and holds the heat connecting part in position; c) injection-molding a molded part to integrally fix the electrode and holder frames together with the heat connecting part; d) mounting the heat connecting part on an upper surface of the heat connecting part; e) electrically connecting the light emitting part with the electrode frames; f) coupling a lens on an upper section of the molded part; and g) cutting portions of the electrode and holder frames to separate the molded part from the frame sheet.

Preferably, the step a) comprises: a-1) punching or etching the frame sheet to form the opposing electrode frames and the holder frame; and a-2) bending the electrode frames into an upper end to be exposed to the outside through an upper surface of the molded part, a lower end to be exposed to the outside through the molded part and a body between the upper and lower ends, the electrode frames bent to give a height difference between the upper and lower ends, and bending the holder frame into an upper end to elastically contact a holding portion of the heat connecting part, a lower end to be exposed to the outside through the molded part and a body between the upper and lower ends, the holder frame bent to give a height difference between the upper and lower ends.

Preferably, the step b) comprising elastically inserting the leading end of the holder frame into the holding portion formed in an outer surface of a body of the heat connecting part to be held in position.

Preferably, the step c) comprises protruding an upper end of the heat connecting part from an upper surface of the molded part to give a predetermined height difference between a mounting area of the heat connecting part where the light emitting part is mounted and an uppermost surface of the molded part.

Preferably, the step c) comprises forming an assembly step in an upper surface of the molded part to be fitted to a lower inner circumference of the lens.

Preferably, the step c) comprises forming cutaway portions in exterior portions of the molded part, the cutaway portions allowing lower ends of the electrode and holder frames to be cut in positions most adjacent to the molded part.

Preferably, the step c) comprises forming a groove in an upper surface of the molded part, the groove receiving the encapsulating material when it is more than filling up the space between the lens and the molded part, thereby preventing the encapsulating material from flowing to the outside.

Preferably, the step c) forms the molded part so that upper ends of the electrode frames are exposed through an upper surface of the molded part.

Preferably, the step f) comprises filling an encapsulating material into a space between the lens and the molded part before coupling the lens to the molded part. More preferably, the molded part has a groove for receiving the encapsulating material if leaking out along an interface between the lens and the molded part during coupling the lens on the molded part.

BRIEF DESCRIPTION OF THE DRAWINGS

The above and other objects, features and other advantages of the present invention will be more clearly understood from the following detailed description taken in conjunction with the accompanying drawings, in which:

FIG. 3b is a cross-sectional view taken along the line A-A' of FIG. 3a;

FIG. 3c is a cross-sectional view taken along the line B-B' of FIG. 3a;

FIG. 3d is a bottom view of the high power LED shown in FIG. 3a;

FIG. 6b is a front elevation view of the conventional LED package of FIG. 6a.

DETAILED DESCRIPTION OF THE PREFERRED EMBODIMENT

The present invention will now be described more fully hereinafter with reference to the accompanying drawings, in which preferred embodiments of the invention are shown.

Figure 1:
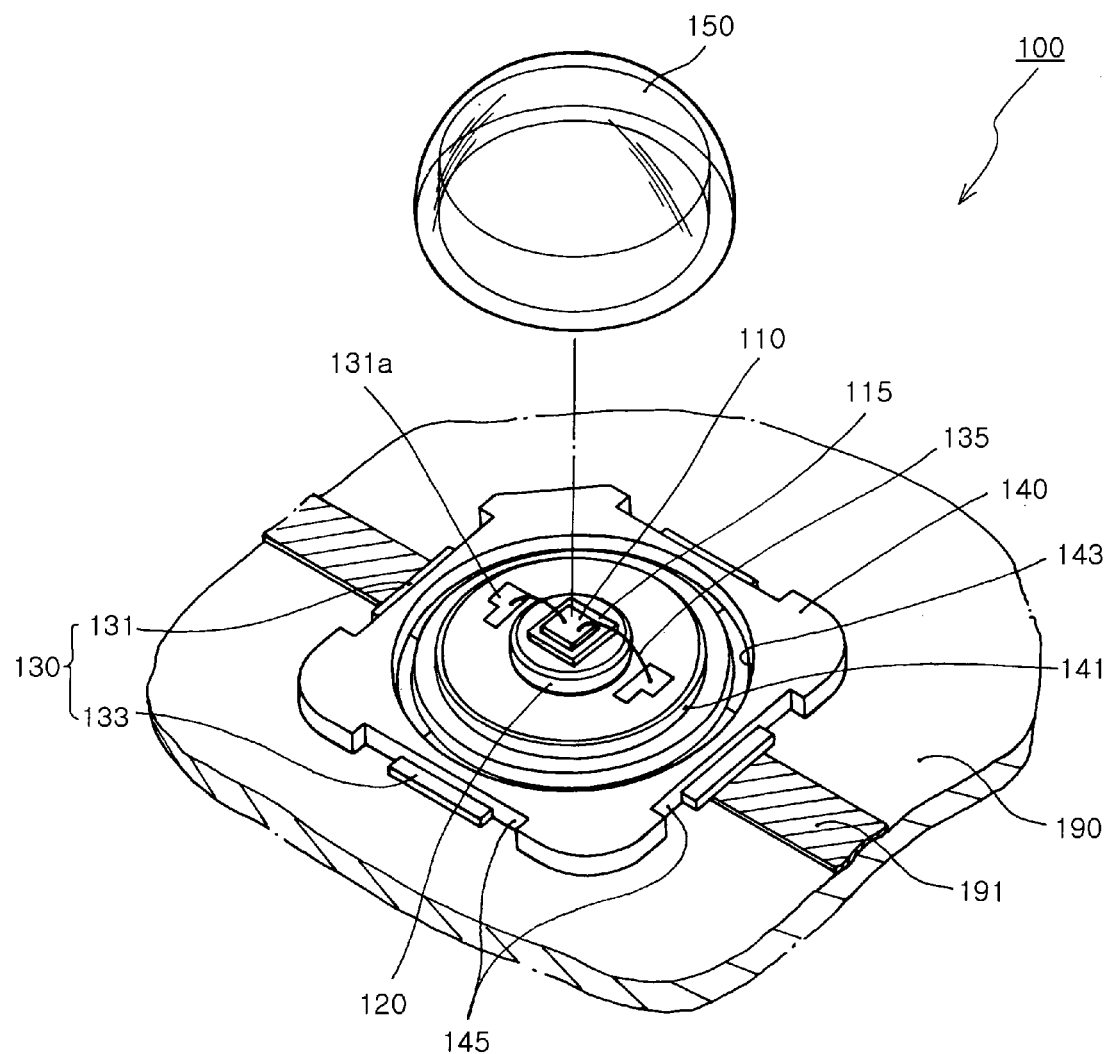
FIG. 1 is a perspective view of a high power LED package according to an embodiment of the invention, capped with a lens.
Figure 2:
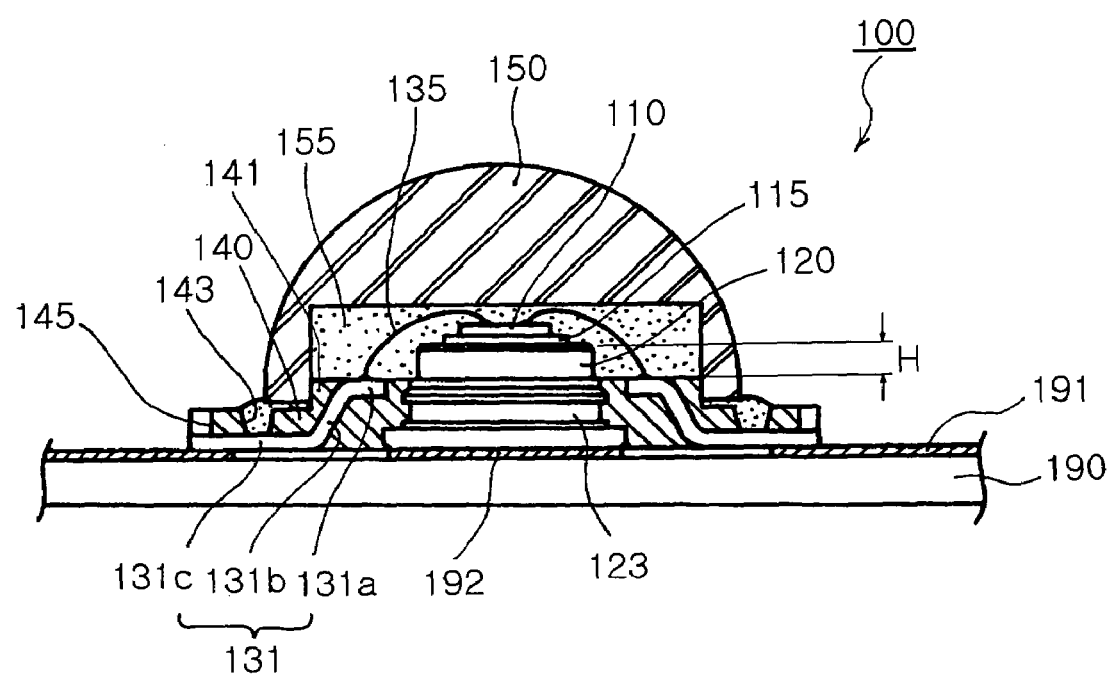
FIG. 2 is a vertical cross-sectional view of the high power LED package of the invention.
Figure 3A:
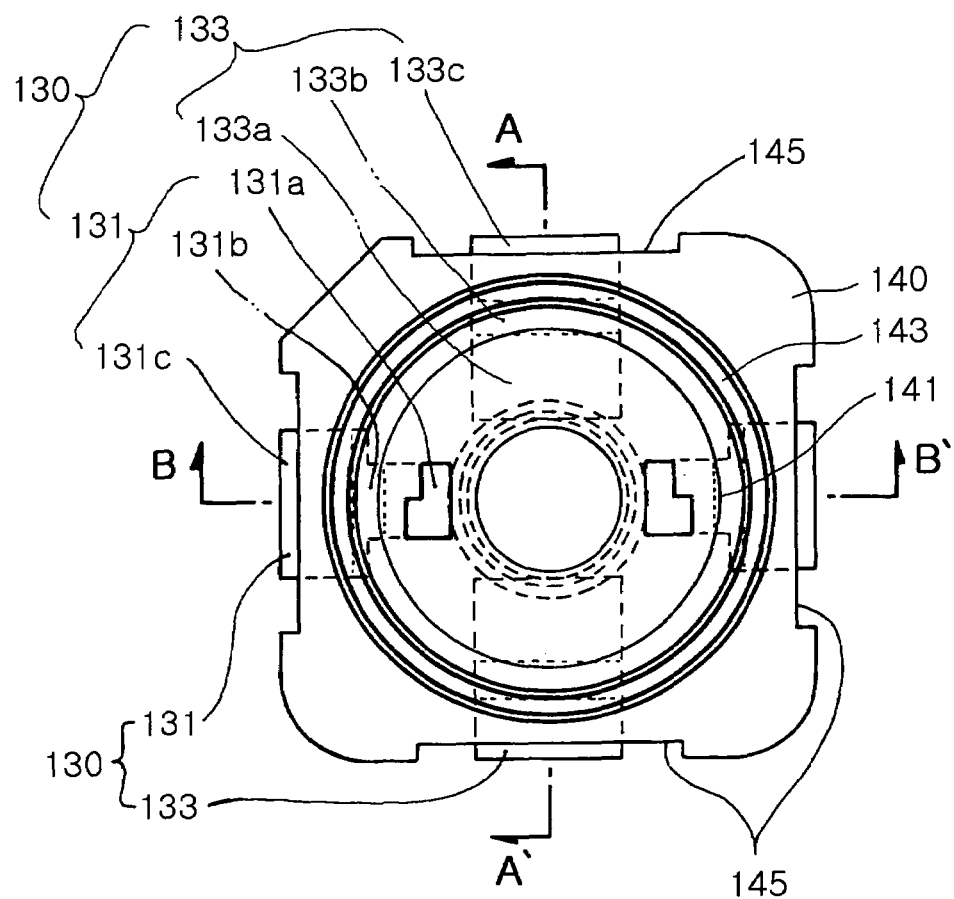
FIG. 3a is a plan view of a high power LED package according to an embodiment of the invention.
Figure 3B:
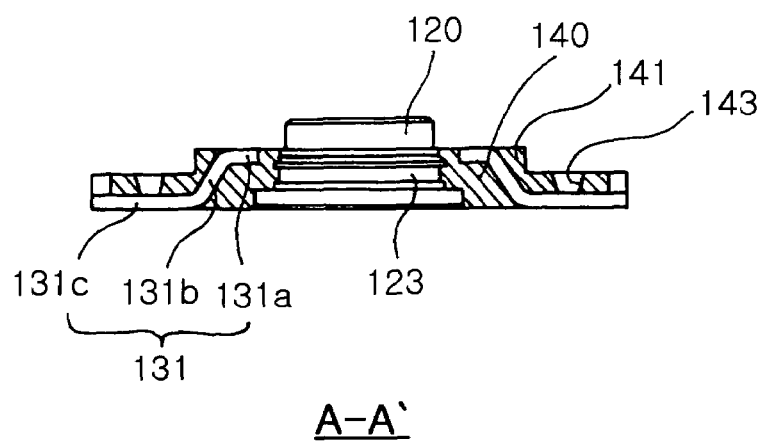
Figure 3C:
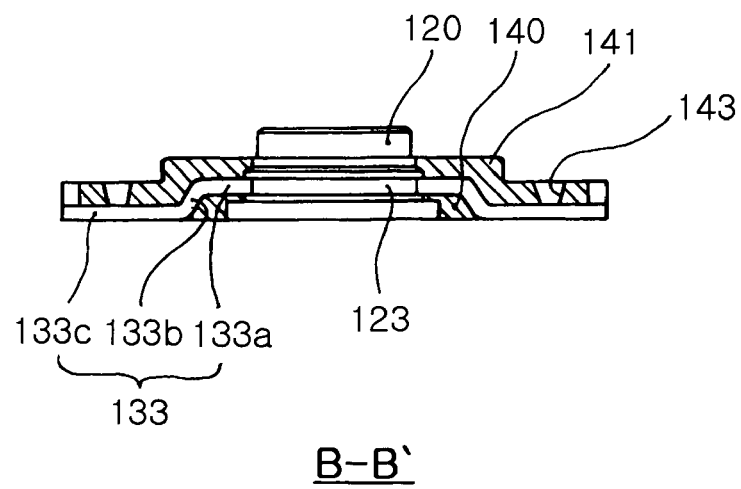
Figure 3D:
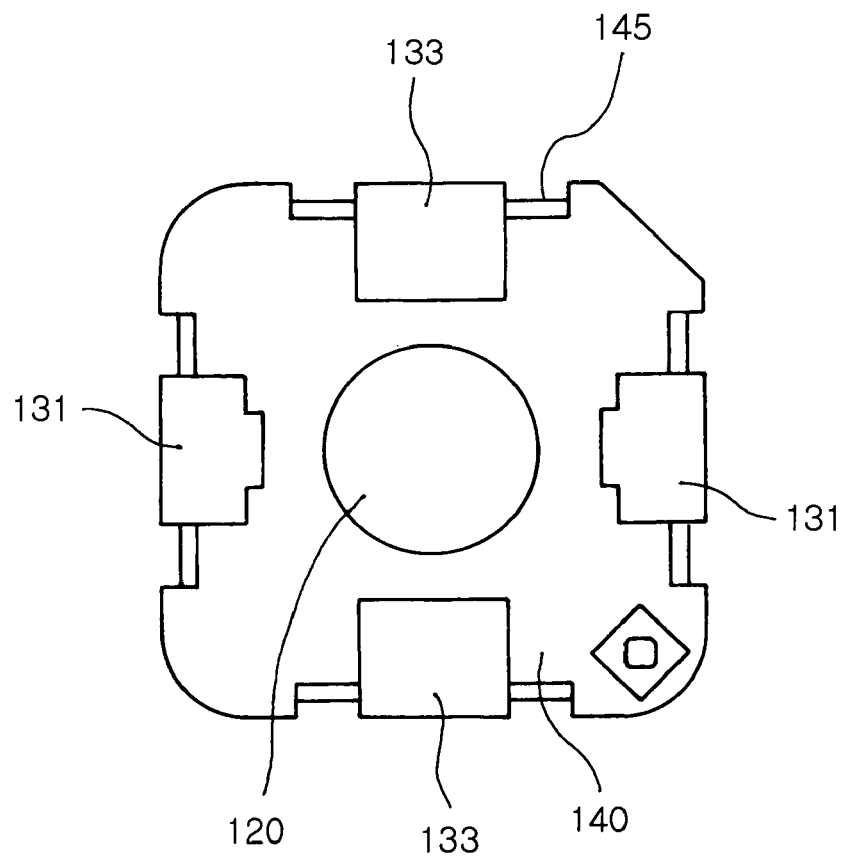

As shown in FIGS. 1 and 2, an LED package 100 according to an embodiment of the invention is designed to dispose a light source, which emits light in response to current applied, above the upper surface of a molded part in order to optimize the unique beam angle of the light source, thereby maximizing lighting efficiency. The LED package 100 includes a light emitting part 110, a heat connecting part 120, frames 130 and a molded part 140.

The light emitting part 110 is at least one LED that is a semiconductor device for generating light accompanied with heat when current flows through it.

Such an LED is composed of an active layer and cladding layers formed on both sides of the active layer, and can be made of but not limited to various semiconductor materials such as GaAlAs, AlGaIn used for a red semiconductor laser device of a high density optical disk, AlGaInP, AlGaInPAs, GaN used for an electronic device such as a transistor, and so on.

The heat connecting part 120 has the light emitting part 110 mounted on the upper surface thereof as shown in FIGS. 1 and 2, and when the light emitting part 110 emits light, serves as a heat radiating means for transferring heat from the light emitting part 110 to the board 190. Thus, the heat connecting part 120 is also referred to as "heat sink slug."

The heat connecting part 120 is made of a high heat conductivity metal to efficiently transfer heat from the light emitting part 110 to the board 190. More specifically, the heat connecting part 120 may be a member made of Cu, Ag, Al, Fe, Ni, W or ally containing at least one thereof with its outer surface plated with Ni, Ag or alloy containing at least one thereof.

The light emitting part 110 mounted on the top of the heat connecting part 120 is fixedly bonded to the upper surface of a submount 115 by means of solders such as Au—Sn and Pb—Sn or adhesive such as Ag paste. Alternatively, the light emitting part 110 may be directly mounted on the heat connecting part 120.

The heat connecting part 120 comprises a cylindrical body having planar top and underside surfaces as shown in FIGS. 3a to 3d. On the outer circumference of the body, a holding portion 123 is formed to contact and hold the leading end of a holder frame 133 of each frame 130.

Preferably, the holding portion 123 is a ring-shaped groove continuously extending along the outer circumference of the body of the heat connecting part 120, by which the leading end of the holder frame 133 can be elastically held.

In the heat connecting part 120 mounted on the upper surface of the board 190, the underside surface of the heat connecting part 120 contacting the board 190 is sized wider than that of the upper surface where the light emitting part 110 is mounted. The underside surface of the light emitting part 120 is not covered by the underside surface of the molded part 140 but directly bonded to a heat connecting layer 192 on the top of the board 190 in order to enhance heat radiating efficiency.

The frames 130 include a pair of electrode frames 131 and two (or at least one) holder frames 133 as shown in FIGS. 1 to 3d. The electrode frames 131 have one end electrically connected to one end of wires 135, which are bonded at the other end to the light emitting part 11. The leading end of the holder frames 133 elastically contacts the holding portion 123 of the heat connecting part 120 to be held in position thereby.

The frames 130 are made of a metal such as Cu, Ni and Fe or an alloy containing at least one thereof, and the outer surface of the frames 130 is plated with a metal such as Ni, Ag and Au or an alloy containing at least one thereof.

The electrode frames 131 are a pair of electrode members disposed opposite to each other at both sides of the heat connecting parts 120 without contacting the latter. Each of the electrode frames 131 is comprised of an upper end 131a exposed through the upper surface of the molded part 140, a lower end 13c exposed to the outside through the underside surface of the molded part 140 and a body 131b buried in the molded part 14d. The electrode-frame 131 is bent or stepped to give a height difference between the upper and lower ends 131a and 131c.

The lower end of the electrode frame 131 is extended to a minimum length for achieving electrical connection to a pattern circuit printed on the top of the board 190, and exposed to the outside through the underside surface of the molded part 140.

The holder frames 133 each are of a holder member disposed between the electrode frames 131, contacting the heat connecting member 120. The holder frame 133 is comprised of an upper end 133a elastically contacting the holding portion 123 formed in the outer circumference of the heat connecting member 120 to generate holding force, a lower end 133c exposed to the outside of the molded part 140 and a body 133b buried in the molded part 140. The holder frame 133 is bent or stepped to give a height difference between the upper and lower ends 133a and 133c.

The upper end 133a of the holder frame 133 is formed straight to make a line contact with the holding portion 123 of the heat connecting part 120, but not limited thereto. Rather, the upper end 133a may be arched or curved in to have a surface contact with the holding portion 123, resulting in more contact area therebetween.

Here, the shortest distance between the opposite upper ends 131a of the electrode frames 131 is preferably larger than the outside diameter of the uppermost end of the heat connecting part 120 and of the holding portion 123 but smaller than the diameter of the lowermost end of the heat connecting part 120.

The holder frames 133 are provided as a pair of frames each disposed between the pair of electrode frames 131 to securely produce holding force for holding the heat connecting member 120 in position, but not limited thereto. Rather, certain embodiments of the invention may provide only one holder frame disposed between the electrode frames 131 to produce minimum holding force for holding the heat connecting part 120 in position.

Here, the shortest distance between the opposite upper ends 133a of the holder frames 133 is preferably larger than the outside diameter of the uppermost end of the holding portion 123 grooved in the outer circumference of the heat connecting part 120.

Accordingly, when the heat connecting part 120 is coupled with the frames 130, the heat connecting part 120 inserted through a space between the electrode frames 131 and the holder frames 133 is elastically held by the end of the pair of holder frames 133, and even if the holding portion 123 fails to hold the holder frames 133, the lower end of the heat connecting part 120 is caught by the electrode frames 131. This as a result prevents any assembly error of the heat connecting part 120 passing by the frames 130.

Furthermore, the lower end of the holder frames 133 exposed through the underside surface of the molded part 140 is preferably bonded to the upper surface of the board 190 via heat conductive metal, thereby to efficiently transfer heat to the board 190 when it is transferred through the contact with the heat connecting part 120 to the holder frames 133.

The pair of electrode frames 131 and the pair of holder frames 133 are disposed at a uniform interval around the heat connecting part 120.

In the meantime, the molded part 140 is an injection-molded resin part serving to integrally couple the frames 130 together the heat connecting part 120 which is pre-assembled with the electrode and holder frames 131 and 133 of the frames 130 as shown in FIGS. 1 to 3d.

The molded part 140 forming a package body is preferably made of polymeric resin that can be easily injection-molded but not limited thereto. Rather, various resins may be used to form the molded part 140.

The molded part 140 is injection-molded in such a fashion that the upper surface of the heat connecting part 120 is protruded to a predetermined height H beyond the upper surface of the molded part 140, thereby giving a height difference of a predetermined size or more between the uppermost surface of the molded part 140 and a mounting area of the heat connecting part 120 where the light emitting part 110 is mounted.

Here, the height difference is set in such a range that can give a beam angle of 180° or more to the light generated from the light emitting part 110.

In exterior portions of the molded part 140 corresponding to the electrode and holder frames 131 and 133, cutaway portions 145 are provided to expose the lower ends of the electrode and holder frames 131 and 133. The cutaway portions 145 make it possible to cut the electrode and holder frames 131 and 133 from a frame sheet F (see FIG. 5a) in positions most adjacent to the molded part 140.

The cutaway portions 145 are recesses formed in those portions of the molded part 140 corresponding to the electrode and holder frames 131 and 133, depressed from the outer surfaces of the molded part 140 toward the heat connecting part 120 to a predetermined extent. The cutaway portions 145 are preferably sized larger than the width of the electrode and holder frames 131 and 133.

As shown in FIGS. 1 and 2, at least one lens 150 is coupled on an upper section of the molded part 140. The lens 150 is shaped to project the light emitted from the light emitting part 110 to the outside at a large beam angle. Encapsulating material 155 is filled in the space between the molded part 140 and the lens 150 to protect the light emitting part 150.

Here, the lens 150 is preferably made of but not limited to epoxies or glasses so that it can be assembled by reflow. Alternatively, the lens 150 can be made of any transparent resin such as polycarbonate, polymethyl metacrylate (PMMA), optical nylon, cyclic olefin copolymer (COC), ATON® and ZEONEX®.

The encapsulating material 155 may be made of any transparent resin material such as silicone and epoxy which has fluidity to uniformly spread in the space between the molded part 140 and the lens 150.

It is preferable that the encapsulating material is made of gel-type resilient resin, which is not readily susceptible to transformations by single wavelength light such as yellowing, and has a high refractive index and superior optical properties. Further, silicone used for the encapsulating material is able to maintain a gel or an elastomer state, even after cured, unlike epoxy, and thus can protect the light emitting part 110 more stably from heat stress, vibrations and impacts from the outside.

Furthermore, the molded part 140 has an assembly step 141 formed in the upper surface thereof so that the lower inner periphery of the lens 150 is fitted around the assembly step 141 and then mechanically assembled or bonded by adhesive thereto when the lens 150 is coupled with the molded part 140.

In the upper surface of the molded part 140, a groove 143 is formed to a predetermined depth. The groove 143 serves to receive encapsulating material if it is more than filling up the space between the lens 150 and the molded part 140, thereby preventing the encapsulating material from flowing to the outside.

Preferably, the groove 143 is ring-shaped and surrounds the outer circumference of the lower end of the lens 150.

Figure 4:
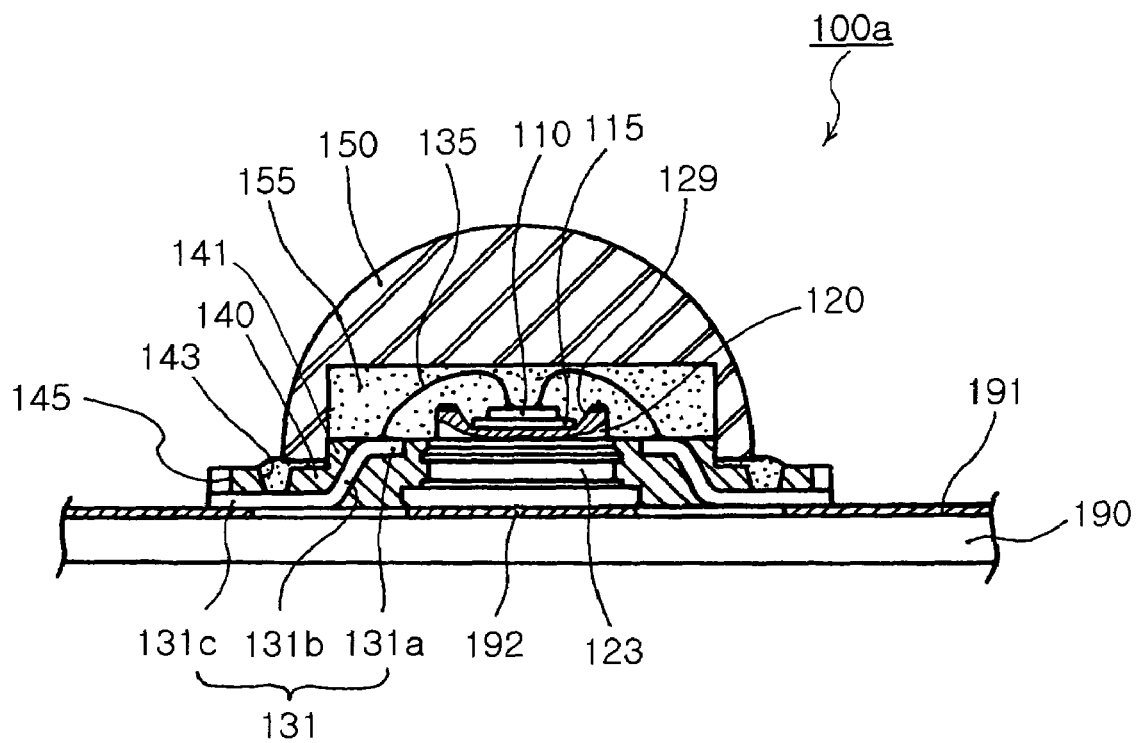
FIG. 4 is a vertical cross-sectional view of a high power LED package according to another embodiment of the invention, capped with a lens.

FIG. 4 is a vertical cross-sectional view of a high power LED package according to another embodiment of the invention. As shown in FIG. 4, in an LED package 100a of this embodiment, a heat connecting part 120 has a reflector 129 in a top portion thereof where a light emitting part 110 is mounted. The reflector 129 is depressed downward to a predetermined depth to form an inclined reflecting surface. The reflector 129 is formed when the heat connecting part 120 is machined.

Figure 5A:
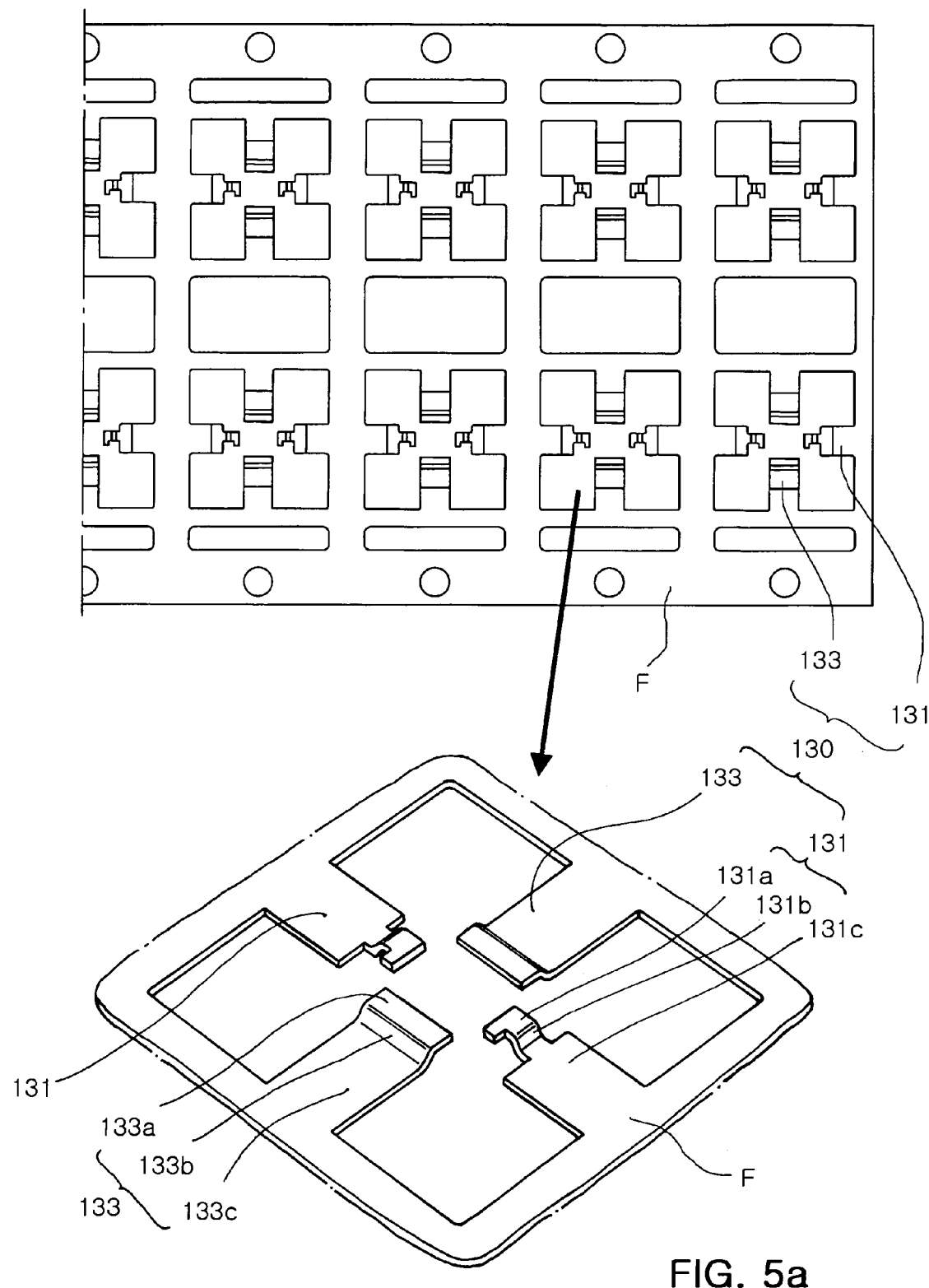
FIGS. 5a to 5e are views illustrating a process of fabricating a high power LED package according to an embodiment of the invention.

FIGS. 5a to 5e are views illustrating a process of fabricating a high power LED 100 package according to an embodiment of the invention, in which the high power LED package 100 is fabricated through following steps a to g.

a. Preparing a Frame Sheet with a Pair of Opposing Electrode Frames and Holder Frames Machined Therein A metal plate or frame sheet F is punched or etched to form a plurality of frames 130 simultaneously in plural portions thereof, each of which includes a pair of opposing electrode frames 131 and two (or at least one) holder frames 133 as shown in FIG. 5a.

The holder frames 133 are a pair of opposing frames 132 so that the electrode frames 131 and the holder frames 133 are disposed in the form of a cross with an included angle of 90°.

In succession, the punched or etched electrode frames 131 each are pressed by a press machine (not shown) to have an upper end 131a to be exposed through an upper surface of a molded part 140 (see FIG. 5b), a lower end 131c to be exposed through the underside surface of the molded part 140 and a body 131b to be buried in the molded part 140. The electrode frame 131 is bent or stepped to give a height difference between the upper and lower ends 131a and 131c.

Figure 5B:
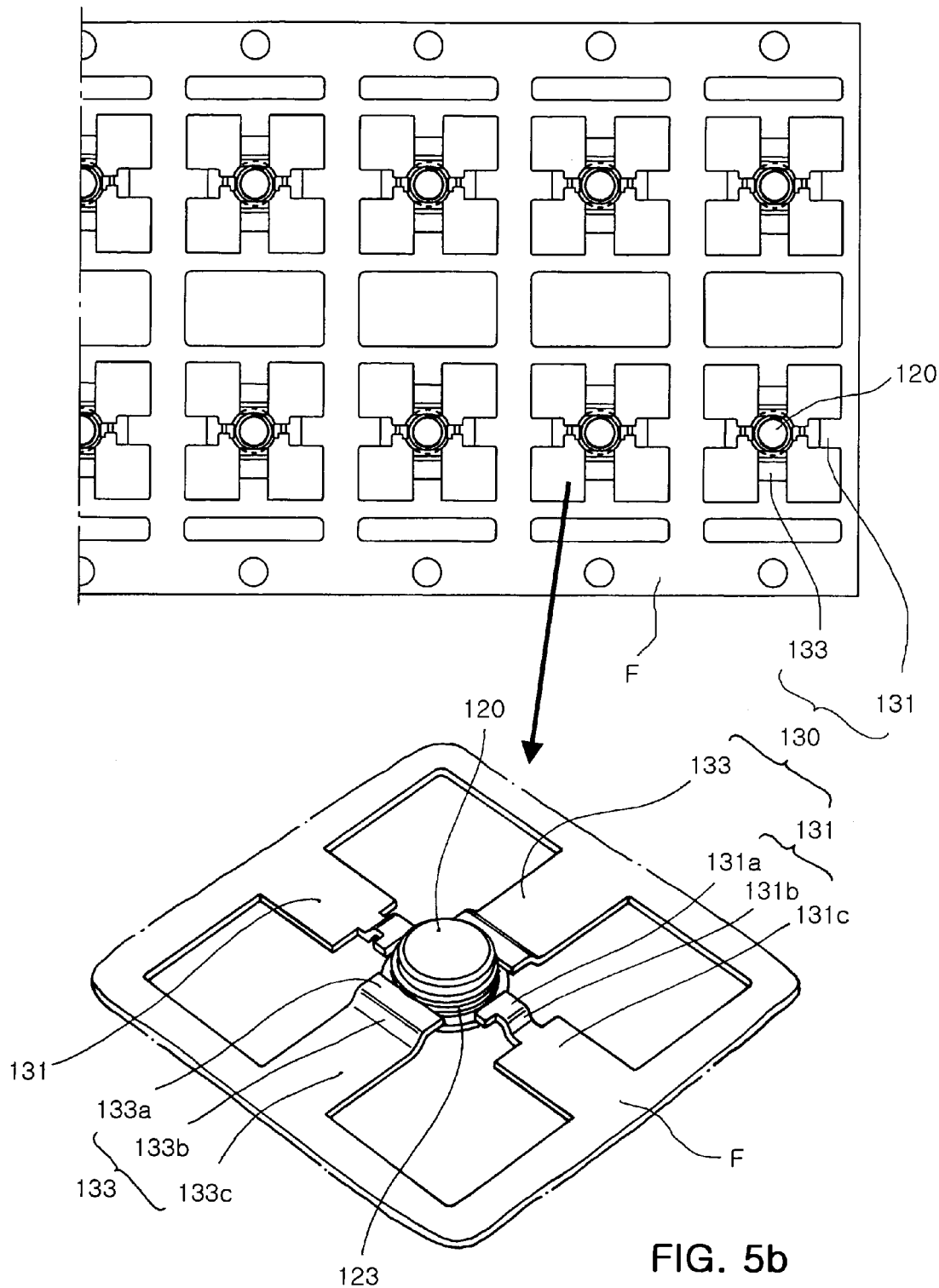

At the same time, the holder frames 133 each are pressed by the same press machine (not shown) to have an upper end 133a, which will elastically contact the holding portion 123 formed in the outer circumference of the heat connecting member 120 to generate holding force, a lower end 133c to be exposed to the outside of the molded part 140 and a body 133b to be buried in the molded part 140. The holder frame 133 is bent or stepped to give a height difference between the upper and lower ends 133a and 133c.

b. Inserting the Heat Connecting Part into Contact with the Leading End of the Holder Frames to Hold the Same A plurality of heat connecting parts 120 are machined into a cylindrical shape out of heat conductive metal. As shown in FIG. 5b, each of the heat connecting parts 120 is inserted under external force vertically through a space between the electrode frames 131 and the holder frames 133 so that an upper section of the heat connecting part 120 passes through the space and a holding portion 123 grooved like a ring along the outer circumference of the heat connecting part 120 contacts the upper ends of the holder frames 133 which are elastically inserted thereinto.

Then, the heat connecting part 120 is held in position at a crossing where the axis of the electrode frames 131 meets with that of the holder frames 133.

Figure 5C:
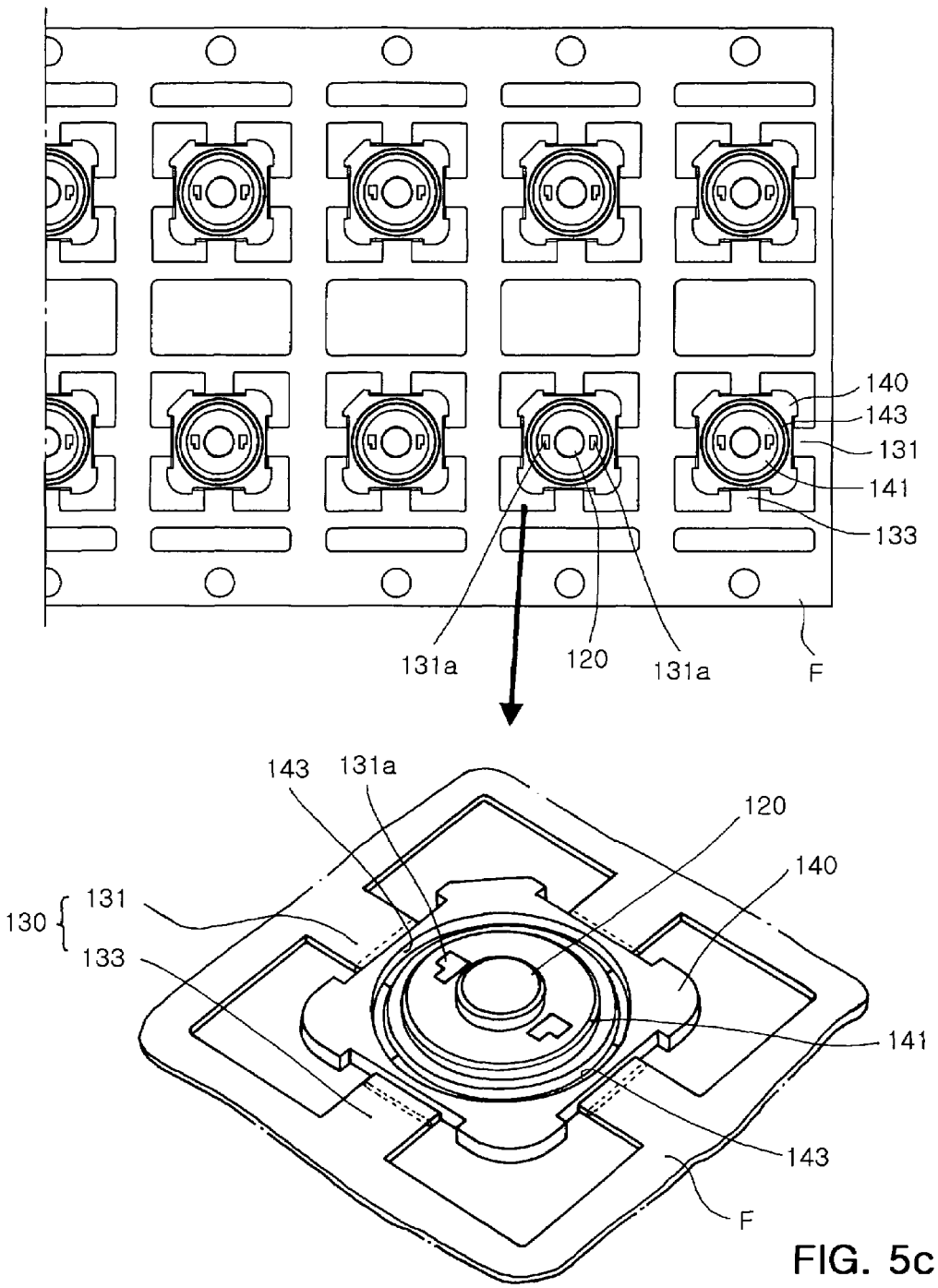

In this case, the outside diameter of the heat connecting part 120 in a section corresponding to the top ends of the opposing electrode frames 131 is smaller than the shortest distance between the electrode frames 131, and thus the electrode frames 131 are spaced from the heat connecting part 120 at a predetermined interval.

c. Injection-Molding the Molded Part to Integrally Fix the Electrode and Holder Frames with the Heat Connecting Part Upon completion of holding the heat connecting part 120 in position by the holder frames 133 of the frames 130, the frames 130 together with the heat connecting part 120 are disposed between upper and lower mold parts (not shown), and the upper and lower mold parts are assembled together into a mold. Then, as shown in FIG. 5c, resin is injected into the mold to form the molded part 140 that integrally fixes the frames 130 and the heat connecting parts 120.

In such injection molding of the molded part 140, the upper end of the heat connecting part 120 is protruded beyond the upper surface of the molded part 140 at a predetermined height H to make a predetermined height difference between the mounting area of the molded part 140 where a light emitting part 110 (see FIG. 5d) is mounted and the uppermost surface of the molded part 140.

Here, the height difference is set in such a range that can give a beam angle of 180° or more to the light generated from the light emitting part 110, and can be adjusted by varying the height or thickness of the heat connecting part 120 or varying the mold structure for the molded part 140.

Furthermore, the molded part 140 has an assembly step 141 formed in the upper surface thereof so that the lower inner periphery of the lens 150 is fitted around the assembly step 141 and thus the lens 150 is easily coupled on the molded part 140. In exterior portions of the molded part 140 corresponding to the electrode and holder frames 131 and 133, cutaway portions 145 are provided. With the cutaway portions 145, the electrode and holder frames 131 and 133 exposed to the outside can be cut from the frame sheet F in positions most adjacent to the molded part 140.

Furthermore, in the upper surface of the molded part 140, a groove 143 is formed to a predetermined depth. The groove 143 serves to receive encapsulating material if it is more than filling up the space between the lens 150 and the molded part 140, thereby preventing the encapsulating material from flowing to the outside.

With the ring-shaped groove 143 formed in the upper surface of the molded part 140 corresponding to the lower outer circumference of the lens 150, encapsulating material 115 (see FIG. 4) leaking along the interface between the lens 150 and the molded part 140 in the assembling step of the lens 150 is received in the groove 143 before flowing out to those portions of the frames 130 exposed through the molded part 140. This as a result can prevent soiling of the frames 130.

Furthermore, the upper ends of the electrode frames 131 are exposed to the outside through the upper surface of the molded part 140 so that they can be electrically connected to the light emitting part 110.

d. Mounting the Light Emitting Part on the Top of the Heat Connecting Part

Figure 5D:
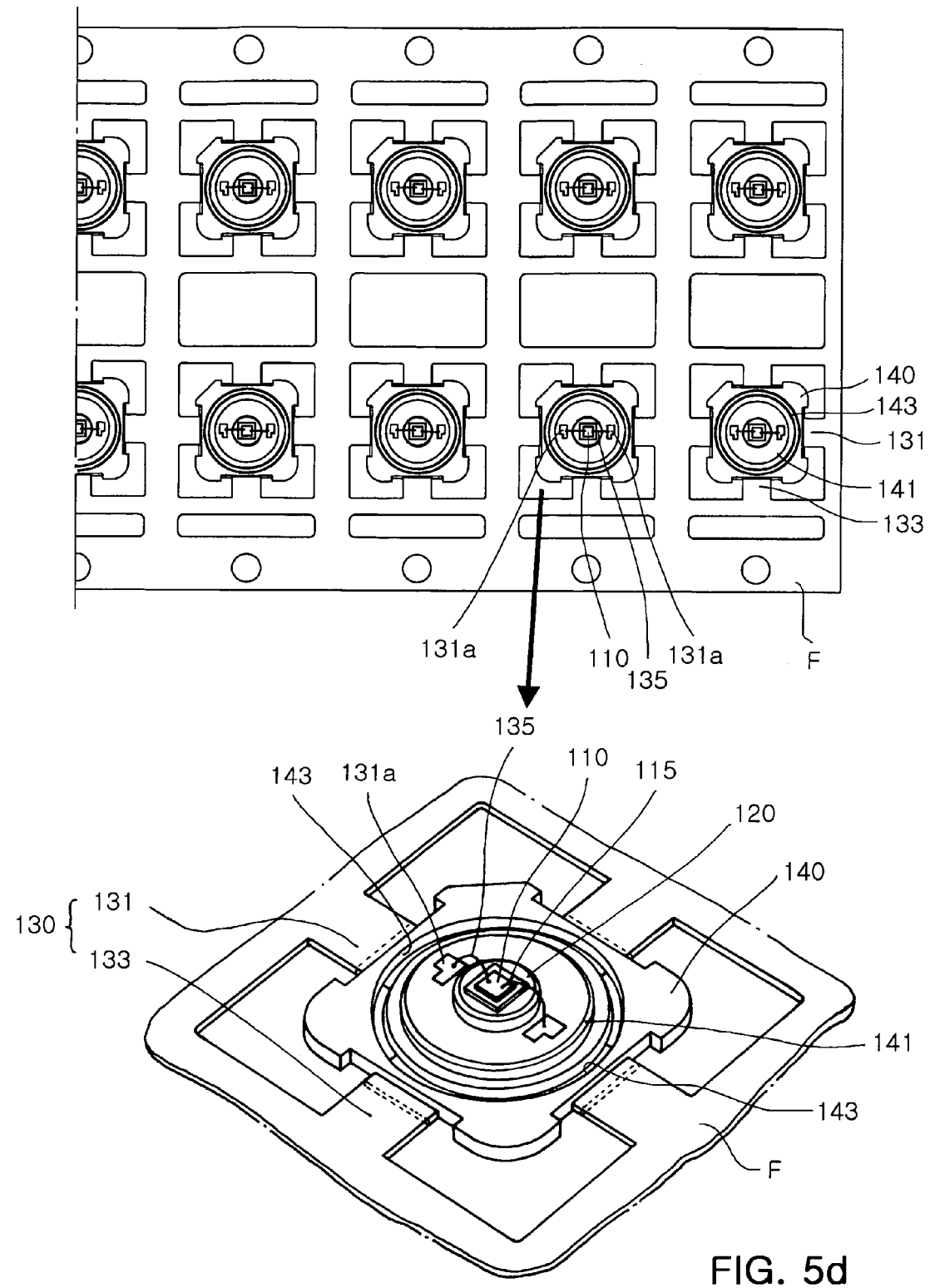

As shown in FIG. 5d, the light emitting part 110 is mounted on the upper surface of the heat connecting part 120 protruded from the upper surface of the molded part 140 to a predetermined height. The light emitting part 110 is a semiconductor device generating light in response to current applied. The light emitting part 110 may be mounted on the heat connecting part 120 preferably via a submount 115.

e. Electrically Connecting the Light Emitting Part with the Electrode Frames

Then, as shown in FIG. 5d, wires 135 are connected at one ends thereof to the light emitting part 110 mounted on the heat connecting part 120 and at the other ends thereof to the upper ends 131a of the electrode frames 131 exposed through the upper surface of the molded part 140 via wire-bonding.

f. Coupling a Lens on an Upper Section of the Molded Part

Figure 5E:
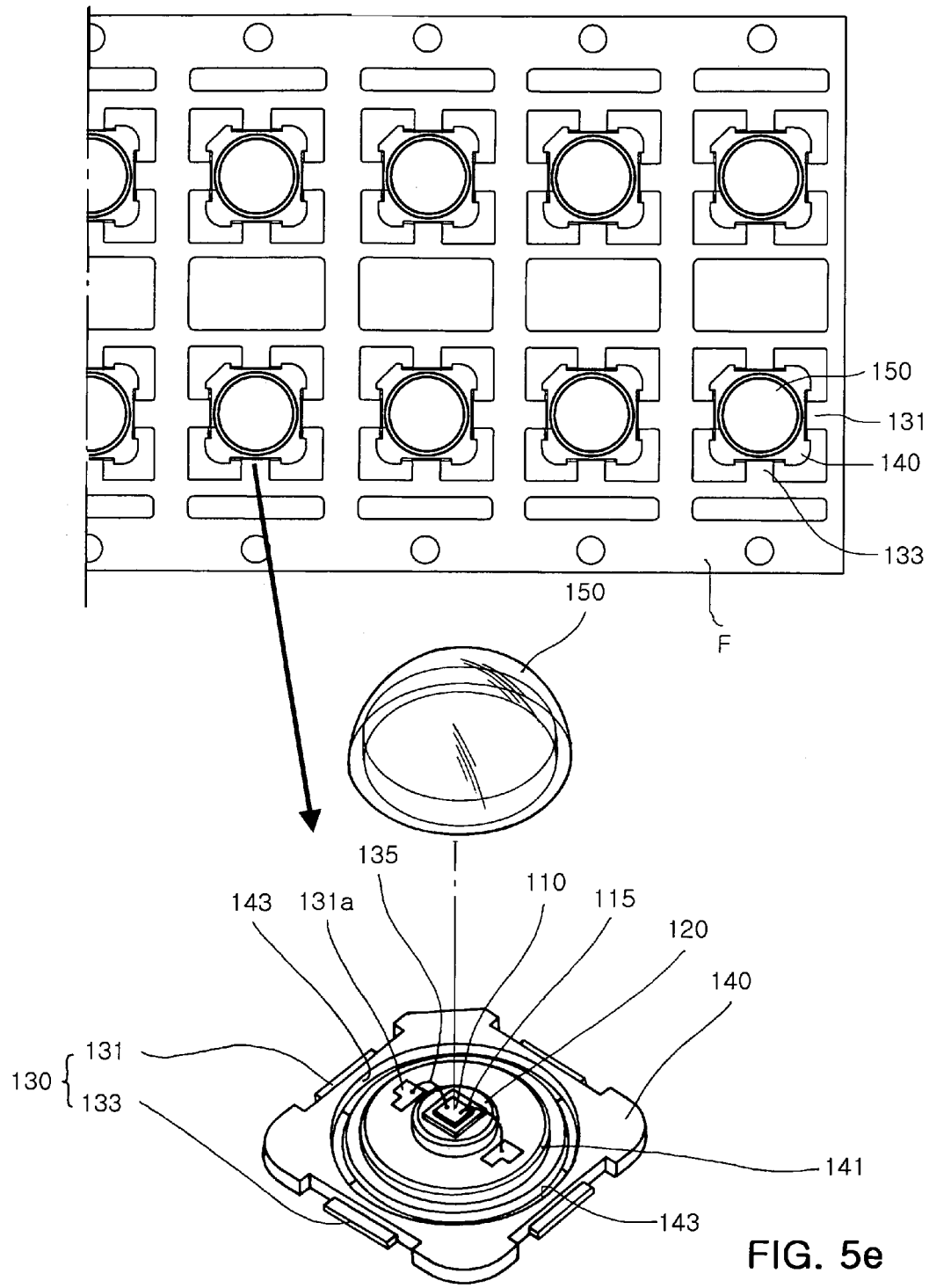
Figure 6A:
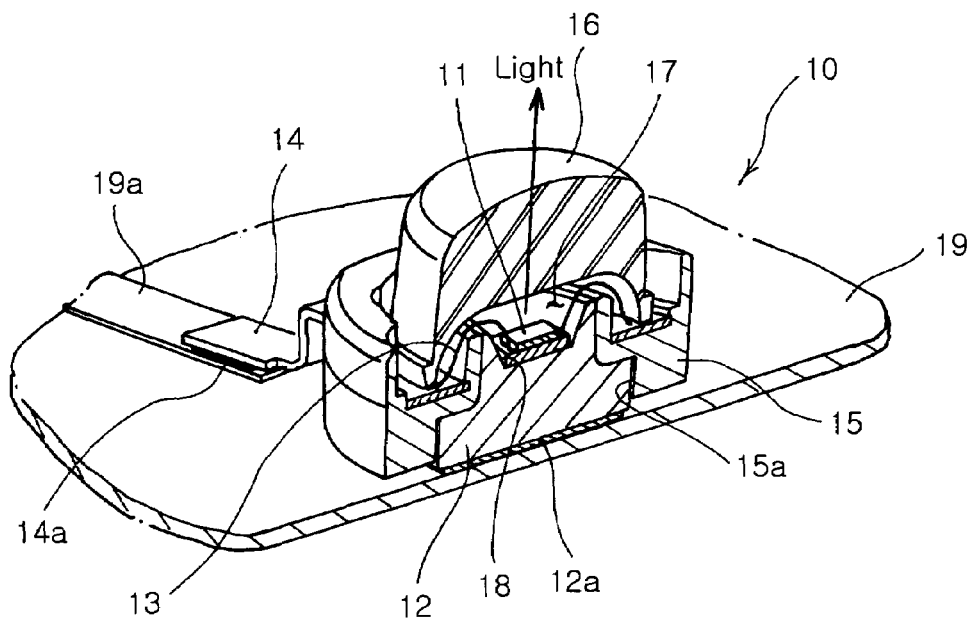
FIG. 6a is a perspective view of a conventional high power LED package mounted on a board, taken vertically along an optical axis thereof.
Figure 6B:
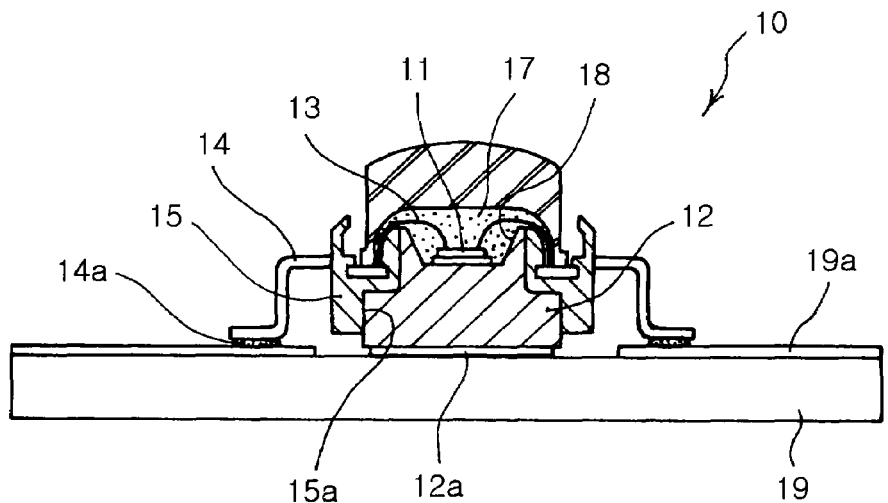

Upon completion of electrically connecting the light emitting part 110 with the electrode frames 131, as shown in FIG. 5e, a lens 150 designed to project light generated from the light emitting part 110 at a wider beam angle is disposed right above the light emitting part 110, and assembled with the molded part 140 so that the lower inner circumference of the lens 150 is fitted around the assembly step 141 on the upper surface of the molded part 140. Such fitting is achieved by press fit or by using adhesive.

This makes the lens 150 be capped on the upper section of the molded part 140.

In the meantime, encapsulating material (see FIG. 4) is filled inside the lens 150 through an opening thereof prior to coupling of the lens 150 on the molded part 140, and then the lens 150 filled with the encapsulating material is coupled on the molded part 140. Then, the encapsulating material can spread uniformly in the space between the molded part and the lens 150, thereby encapsulating and protecting the light emitting part 110.

Here, the encapsulating material 155 filled in the space between the molded part 140 and the lens 150 may partially leaks to the interface between the lens 150 and the molded part 140 in the assembling step of the lens 150. However, the groove 143 of the molded part 140 naturally receives the leaked encapsulating material portion, thereby preventing the leaked encapsulating material portion from soiling the frames 130.

Furthermore, in the upper surface of the molded part 140, a groove 143 is formed to a predetermined depth. The groove serves to With the ring-shaped groove 143 formed in the upper surface of the molded part 140 corresponding to the lower outer circumference of the lens 150, encapsulating material 115 (see FIG. 4) leaking along the interface between the lens 150 and the molded part 140 in the assembling step of the lens 150 is received in the groove 143 before flowing out to those portions of the frames 130 exposed through the molded part 140. This as a result can prevent soiling of the frames 130.

g. Cutting Portions of the Electrode and Holder Frames to Separate the Molded Part from the Frame Sheet With the molded part 140 and the lens 150 coupled together, the lower ends 131a and 133a of the electrode and holder frames 131 and 133 protruded beyond the outer surfaces of the molded part 140 are cut by a cutting machine (not shown) to separate the molded part 140 from the frame sheet F, thereby finally fabricating an LED package 100 with the lens 150 capped on the molded part 140.

According to certain embodiments of the invention as described hereinbefore, the light emitting part is disposed above the upper surface of the molded part in order to optimize the unique beam angle of the light source, thereby maximizing lighting efficiency. In addition, there is no need to consider light reflection and thus high degree of freedom is given to lens design so that various lens types can be adopted.

According to certain embodiments of the invention, the groove is formed in the upper surface of the molded part to prevent overflow of the encapsulating material in the assembling process of the lens, which may otherwise soil adjacent components.

According to certain embodiments of the invention, the lower ends of the electrode and holder frames are cut in positions most adjacent to the molded part. This makes it possible to minimize those portions and volumes of lead frames exposed to the outside, and when the package is mounted on a board, to reduce the mounting space of the package on the board, thereby promoting miniaturization of a product.

Furthermore, according to certain embodiments of the invention, the heat connecting part is integrally fixed with the frames by injection molding, thereby simplifying a fabrication process as well as saving costs by mass production.

While the present invention has been shown and described in connection with the preferred embodiments, it will be apparent to those skilled in the art that modifications and variations can be made without departing from the spirit and scope of the invention as defined by the appended claims.

What is claimed is:

1. A high power light emitting diode package comprising:
   a heat connecting part for mounting a light emitting part on an upper surface thereof, the light emitting part generating light in response to current applied thereto;
   frames electrically connected to the light emitting part while holding the heat connecting part; and
   a molded part fixing the heat connecting part and the frames together,
   wherein the upper surface of the heat connecting part is protruded beyond an upper surface of the molded part to a predetermined height so that the upper surface of the heat connecting part is positioned higher than the upper surface of the molded part, and
   the heat connecting part has a holding portion formed in an outer circumference of a body thereof to contact leading ends of the frames, thereby generating holding force for holding the heat connecting part in position,
wherein the holding portion comprises a groove continuously extending around the outer circumference of the heat connecting part body, and the leading ends of the frames are elastically held when insertedly fitted into the groove of the holding portion.

2. The high power light emitting diode package according to claim 1, wherein the light emitting part comprises at least one light emitting diode.

3. The high power light emitting diode package according to claim 1, wherein the heat connecting part is protruded from the upper surface of the molded part to a predetermined height so that light generated from the light emitting part on the heat connecting part has a beam angle of 180° or more.

4. The high power light emitting diode package according to claim 1, wherein the heat connecting part comprises a heat conductive metal member for transferring heat generated from the light emitting part to a board, the heat being generated during light emission of the light emitting part.

5. The high power light emitting diode package according to claim 4, wherein the heat conductive metal member comprises at least one selected from the group consisting of Cu, Ag, Al, Fe, Ni, W and alloys containing at least one thereof.

6. The high power light emitting diode package according to claim 1, wherein the heat connecting part is extended through the molded part so that the underside surface of the heat connecting part is exposed to the outside through an underside surface of the molded part.

7. The high power light emitting diode package according to claim 1, wherein the heat connecting part has a reflector formed in a top portion thereof where the light emitting part is mounted, the reflector being depressed to a predetermined depth to have an inclined reflecting surface.

8. The high power light emitting diode package according to claim 1, wherein the frames comprise a pair of electrode frames electrically connected with the light emitting part via wires and at least one holder frame electrically isolated from the electrode frames, the holder frame having a leading end contacting and held by the heat connecting part.

9. The high power light emitting diode package according to claim 8, wherein the pair of electrode frames are disposed at both sides of the heat connecting part, opposing each other, and the holder frame is disposed between the electrode frames.

10. The high power light emitting diode package according to claim 8, wherein the holder frame comprises a pair of frames each of which is disposed between the electrode frames.

11. The high power light emitting diode package according to claim 8, wherein each of the electrode frames has an upper end exposed to the outside through the upper surface of the molded part, a lower end exposed to the outside through an underside surface of the molded part and a body buried in the molded part, the electrode frame bent to give a height difference between the upper and lower ends.

12. The high power light emitting diode package according to claim 8, wherein the electrode frames and a pair of the holder frame are disposed around the heat connecting part with a uniform interval.

13. The high power light emitting diode package according to claim 8, wherein the holder frame has an upper end contacting an outer surface of the heat connecting part to generate holding force, a lower end exposed to the outside through the molded part and a body buried in the molded part, the holder frame bent to give a height difference between the upper and lower ends.

14. The high power light emitting diode package according to claim 8, wherein the leading end of the holder frame is formed straight to have a line contact with an outer surface of the heat connecting part.

15. The high power light emitting diode package according to claim 8, wherein the leading end of the holder frame is arched inward to have a surface contact with an outer surface of the heat connecting part.

16. The high power light emitting diode package according to claim 1, wherein the molded part has cutaway portions formed in exterior portions thereof to expose lower ends of the frames to the outside.

17. The high power light emitting diode package according to claim 16, wherein the cutaway portions are depressed from the exterior portions of the molded part corresponding to the frame lower ends, and sized wider than the width of the frames.

18. The high power light emitting diode package according to claim 1, further comprising:
at least one lens capped on an upper section of the molded part to project the light generated from the light emitting part to the outside at an increased beam angle; and
an encapsulating material filled in a space between the molded part and the lens.

19. The high power light emitting diode package according to claim 18, wherein the molded part has an assembly step formed in the upper surface thereof, the assembly step fitted to a lower inner circumference of the lens.

20. The high power light emitting diode package according to claim 18, wherein the molded part has a groove formed in the upper surface thereof, the groove receiving the encapsulating material when it is more than filling up the space between the lens and the molded part, thereby preventing the encapsulating material from flowing to the outside.

21. The high power light emitting diode package according to claim 20, wherein the groove is continuously extended along a lower outer circumference of the lens.

* * * * *